(12) United States Patent
Suzuki (10) Patent No.: US 7,498,624 B2
(45) Date of Patent: Mar. 3, 2009

(54) SOLID-STATE IMAGING DEVICE

(75) Inventor: Nobuo Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 321 days.

(21) Appl. No.: 11/543,929

(22) Filed: Oct. 6, 2006

(65) Prior Publication Data
US 2008/0083925 A1 Apr. 10, 2008

(30) Foreign Application Priority Data
Oct. 6, 2006 (JP) ............................ P2005-293776

(51) Int. Cl.
*H01L 31/113* (2006.01)
*H01L 31/062* (2006.01)
(52) U.S. Cl. ..................... 257/292; 257/293; 257/443
(58) Field of Classification Search ............... 257/209, 257/292–293, 443, 448, E31.113, E31.062
See application file for complete search history.

(56) References Cited

U.S. PATENT DOCUMENTS 4,672,455 A * 6/1987 Miyatake ..................... 348/311
6,521,920 B2 * 2/2003 Abe ............................ 257/223

FOREIGN PATENT DOCUMENTS

| JP | 2002-502120 A | 1/2002 |
|---|---|---|
| JP | 2002-83946 A | 3/2002 |
| JP | 2002-513145 A | 5/2002 |
| JP | 2003-332551 A | 11/2003 |

* cited by examiner

*Primary Examiner*—Theresa T Doan
(74) *Attorney, Agent, or Firm*—Sughrue Mion, PLLC (57) ABSTRACT

A solid-state imaging device comprises pixels including: a light receiving portion comprising intra-substrate photoelectric conversion portions, formed in a silicon substrate, that detect light rays of different color, an on-substrate photoelectric conversion portion, stacked above the intra-substrate photoelectric conversion portions, that detects light rays of a color differing from the colors detected by the intra-substrate photoelectric conversion portions; first and second signal read circuits that read signals corresponding to electric charges in the intra-substrate photoelectric conversion portions and signals corresponding to electric charges in the on-substrate photoelectric conversion portion, respectively. The electric charges in the intra-substrate photoelectric conversion portions are electrons, and the electric charges in the on-substrate photoelectric conversion portions are positive holes. Each of the first and second signal read circuits comprises an output transistor, a reset transistor and a selection transistor which are n-channel MOS transistors. The drain voltage of the reset transistor of the second signal read circuit is set to be lower than that of the reset transistor of the first signal read circuit.

7 Claims, 4 Drawing Sheets

SOLID-STATE IMAGING DEVICE

BACKGROUND OF THE INVENTION

1. Field of the Invention

The present invention relates to a solid-state imaging device having a large number of pixels arranged in a row direction and in a column direction, which is perpendicular to the row direction.

2. Description of the Related Art

In a single-chip color solid-state imaging device typified by a CCD or CMOS image sensor, three or four kinds of color filters are arranged like a mosaic on an array of light receiving portions adapted to perform photoelectric conversion. Consequently, a color signal corresponding to each of the color filters is outputted from a corresponding one of the light receiving portions. A color image is generated by processing such color signals.

However, in the related color solid-state imaging device in which color filters are arranged like a mosaic, in a case where the filters are primary color filters, the color filters absorb nearly (2/3) of incident light. Thus, the related color solid-state imaging device has problems in that light utilization efficiency is poor, and that sensitivity is low. Also, because each of the light receiving portions can obtain only a single-color signal, the related color solid-state imaging device has problems that a resolution is low, and that false colors are highly visible.

Thus, to overcome such problems, an imaging device configured to stack three layers of photoelectric conversion film on a semiconductor substrate, on which a signal read circuit is formed, has been studied and developed (see, for example, JP-T-2002-502120 and JP-A-2002-83946). The imaging device has a light receiving portion structure in which, for example, photoelectric conversion film layers respectively adapted to generate signal charges (electrons or positive holes) in response to blue (B) light, green (G) light, and red (R) light are sequentially stacked from a light incidence plane. Additionally, each of the light receiving portions is provided with a signal read circuit enabled to independently read a signal charge optically generated in each photoelectric conversion film.

In the case of the imaging device of such a structure, almost all of incident light is photoelectrically converted and is read out. Thus, the use efficiency of visible light is nearly 100%. Additionally, color signals of three colors R, G, B are obtained at each of the light receiving portions. Consequently, this imaging device can generate a favorable image with high sensitivity and high resolution (thus, false colors are unnoticeable in this image).

An imaging device described in JP-T-2002-513145 is provided with a triple well (photodiode), which is adapted to detect an optical signal, in a silicon substrate. Thus, the imaging device obtains signals that respectively having different spectral sensitivities depending on depths in the silicon substrate and also has peaks at the wavelengths of B (blue), G (green) and R (red) from a surface thereof. This imaging device utilizes the fact that the penetration depth of incident light in the silicon substrate depends on the wavelength thereof. This imaging device can obtain an image with high sensitivity and high resolution (thus, false colors are unnoticeable), similarly to the imaging devices described in JP-T-2002-502120 and JP-A-2002-83946.

However, the imaging devices described in JP-T-2002-502120 and JP-A-2002-83946 are required to stack three layers of photoelectric conversion film on a semiconductor substrate in sequence and to form longitudinal wires that connect signal charges, which are generated in the photoelectric conversion layers respectively corresponding to R, G, B, to the signal read circuits formed on the semiconductor substrate. Thus, these imaging devices have problems that these imaging devices are difficult to manufacture, and the manufacturing yields of these devices are low, and that the manufacturing costs of these devices are high.

Meanwhile, the imaging apparatus described in JP-T-2002-513145 is configured so that blue light is detected by the photodiode at the shallowest part, that red light is detected by the photodiode provided at the deepest part, and that green light is detected by the photodiode at an intermediate part. However, for example, optical charges are generated by the photodiode provided at the shallowest part from green light or red light. Thus, this imaging device has a problem that the separation of the spectral sensitivity characteristics of R signal, G signal and B signal is insufficient and that thus, the color reproducibility is low. Also, it is necessary for obtaining net R-, G- and B-signals to perform addition/subtraction operations on output signals of each of the photodiodes. Thus, this imaging device has another problem that the addition/subtraction operations deteriorate the S/N ratios of image signals.

To solve the problems of the imaging devices described in JP-T-2002-502120, JP-A-2002-83946 and JP-T-2002-513145, an imaging device described in JP-A-2003-332551 has been proposed. This imaging device is a hybrid type of the imaging devices described in JP-T-2002-502120, JP-A-2002-83946 and JP-T-2002-513145. The imaging device described in JP-A-2003-332551 is configured so that B-light and R-light are detected by photodiodes which are provided in a silicon substrate, and that G-light is detected by a photoelectric conversion element provided on the silicon substrate. The photoelectric conversion element provided on the silicon substrate includes a first electrode film stacked on the silicon substrate, a photoelectric conversion film which is stacked on the first electrode film and is made of an organic material, and a second electrode film stacked on the photoelectric conversion film. Signal charges generated in the photoelectric conversion film by applying a voltage to each of the first electrode film and the second electrode film are transferred to the first electrode film and the second electrode film. A signal corresponding to the signal charge transferred to one of the electrode films is read by a signal read circuit, such as a CCD or CMOS circuit, provided in the silicon substrate. In the present specification, the term "photoelectric conversion film" is defined as a film adapted to absorb light having been incident thereon and also having a specific wavelength, and to generate electrons and positive holes according to an amount of the absorbed light.

With this configuration, it is sufficient to provided only one layer of the photoelectric conversion film in this imaging device, so that the manufacturing process is simplified, and that both of increase in the cost and decrease in the yield can be prevented. Green light is absorbed by the photoelectric conversion film. Thus, this imaging device has advantages in that separation of the spectral sensitivity characteristics of the photodiodes respectively corresponding to blue light and red light can be improved, that the color reproducibility of the device can favorably be enhanced, and that the S/N ratio is improved.

In the silicon substrate provided with the two photodiodes adapted to detect B-light and R-light, and with the signal read circuits, the mobility of electros is about 3 times that of positive holes. Therefore, generally, n-channel MOS transistors are used as transistors constituting the signal read circuits. Accordingly, electrons are utilized as electric charges taken from the photoelectric conversion film provided in the silicon substrate.

However, photoelectric conversion films made of an organic semiconductor are often used. It is known that according to the general properties of the organic semiconductor, the mobility of positive holes is larger than the mobility of electrons. Thus, in a case where electrons, whose mobility is smaller than that of positive holes, are utilized as electric charges taken from the photoelectric film used to detect G-light, the probability of occurrence of annihilation of electrons during transfer is high. Also, the probability of trapping electrons at a trap level is high. Consequently, the sensitivity for G-light may be lowered.

Meanwhile, in a case where light is incident on the second electrode film from above, the photoelectric conversion film made of an organic semiconductor relatively largely generates electrons in the vicinity thereof in response to light having a wavelength, at which an optical absorption coefficient is large. Therefore, in a case where electrons are captured by the first electrode film, and where light has a wavelength at which the optical absorption coefficient is large, the electrons are transferred a long distance. Consequently, the sensitivity for light having a wavelength, at which the optical absorption coefficient is large, is very largely reduced. Meanwhile, the photoelectric conversion film made of an organic semiconductor generates electrons substantially uniformly in the photoelectric conversion film in response to light having a wavelength at which the optical absorption coefficient is relatively small. Therefore, reduction in the sensitivity is not large, as compared with the reduction in the sensitivity in the case of using light having a wavelength, at which the optical absorption coefficient is large. Thus, in a case where G-light is detected by the photoelectric conversion film in the hybrid type imaging device, the spectral sensitivity characteristic for G-light is adapted so that peak sensitivity is reduced, and that the distribution of the sensitivity is shaped like a gently sloped mountain. Therefore, the color separation characteristic for G-light is degraded. Consequently, the color reproducibility of a color reproduction image is reduced. Even in a case where R-light and B-light are detected by the photoelectric conversion film, the color reproducibility is reduced. However, especially, the reduction in the color reproducibility is significant in the case of detecting G-light.

SUMMARY OF THE INVENTION

The invention is accomplished in view of the above circumstances. An object of the invention is to enhance the sensitivity and the color reproducibility of a hybrid type solid state imaging device.

According to the invention, there is provided a solid-state imaging device comprising a plurality of pixels arranged in a row direction and a column direction perpendicular to the row direction, wherein each of said plurality of pixels comprises: (i) a light receiving portion comprising a plurality of intra-substrate photoelectric conversion portions that are formed in a silicon substrate and that detect light rays of different color, an on-substrate photoelectric conversion portion that is stacked above said plurality of intra-substrate photoelectric conversion portions and that detects light rays of a color differing from the colors detected by said plurality of intra-substrate photoelectric conversion portions; (ii) a first signal read circuit that reads signals corresponding to electric charges generated and stored in the intra-substrate photoelectric conversion portions; and (iii) a second signal read circuit that reads signals corresponding to electric charges generated and stored in the on-substrate photoelectric conversion portion, wherein the electric charges generated and stored in the intra-substrate photoelectric conversion portions are electrons, wherein the electric charges generated and stored in the on-substrate photoelectric conversion portions are positive holes, wherein each of the first signal read circuit and the second signal read circuit comprises an output transistor that converts an electric charge into a signal, a reset transistor that resets an electric charge and a selection transistor that selects the pixel, wherein the output transistor, the reset transistor, and the selection transistor are n-channel MOS transistors, and wherein a drain voltage of the reset transistor of the second signal read circuit is set to be lower than a drain voltage of the reset transistor of the first signal read circuit.

According to the invention, there is provided the solid-state imaging device, wherein the on-substrate photoelectric conversion element comprises: a first electrode film stacked above the semiconductor substrate; a photoelectric conversion film stacked above the first electrode film; and a second electrode film stacked above the photoelectric conversion film, wherein the photoelectric conversion film comprises an organic semiconductor, and wherein a mobility of a positive hole in the organic semiconductor is larger than a mobility of an electron.

According to the invention, there is provided the solid-state imaging device, wherein a voltage is applied to each of the first electrode film and the second electrode film during an imaging time so that a positive hole generated in the photoelectric conversion film is stored in the first electrode film.

According to the invention, there is provided the solid-state imaging device, wherein an input terminal of the second signal read circuit is connected to the first electrode film, and wherein the second signal read circuit comprises a protection circuit that holds a voltage of the first electrode film at a value which is equal to or lower than a predetermined voltage, to protect transistors connected to the first electrode film.

According to the invention, there is provided the solid-state imaging device, wherein the protection circuit is a protection transistor in which its source and its gate are connected to the first electrode film and its drain is connected to a power supply that supplies voltage being less than the predetermined voltage, and wherein the protection transistor conducts the first electrode film to the power supply when a voltage at the gate of the protection transistor is equal to the predetermined voltage.

According to the invention, there is provided the solid-state imaging device, wherein said plurality of intra-substrate photoelectric conversion elements are a plurality of photodiodes which are stacked in a direction of a depth of the semiconductor substrate and which detect light rays of different colors, respectively.

According to the invention, there is provided the solid-state imaging device, wherein said plurality of intra-substrate photoelectric conversion elements comprises: intra-substrate photoelectric conversion elements that detects blue light; and intra-substrate photoelectric conversion element that detects red light, and wherein the on-substrate photoelectric conversion element detects green light.

DETAILED DESCRIPTION OF THE INVENTION

Hereinafter, an embodiment according to the invention is described with reference to the accompanying drawings.

Figure 1:
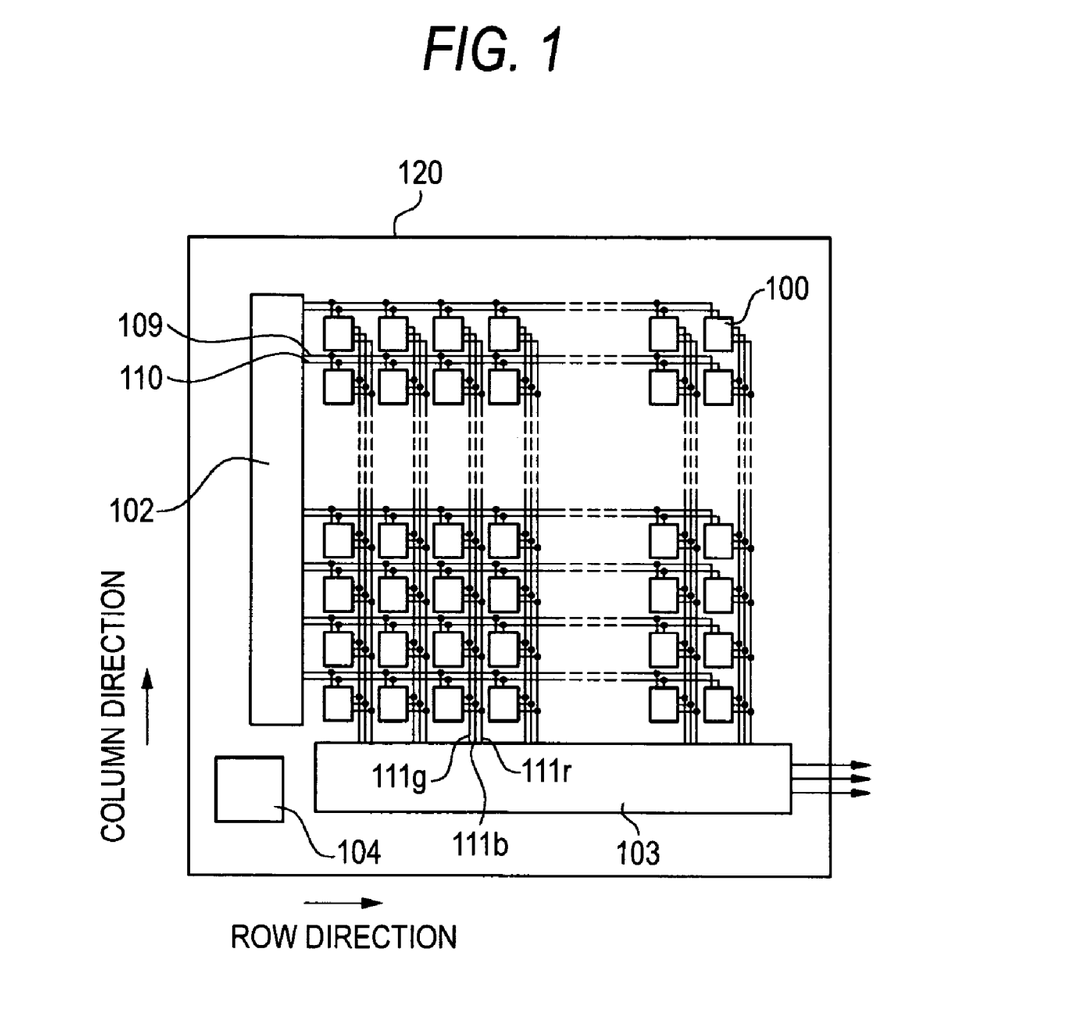
FIG. 1 is a surface schematic view illustrating the configuration of a hybrid-type solid-state imaging device, which is an embodiment of the invention.

FIG. 1 is a surface schematic view illustrating the configuration of a hybrid-type solid-state imaging device, which is an embodiment of the invention.

The solid-state imaging device shown in FIG. 1 has a large number of pixels 100 arranged in a square lattice pattern, the opposed two sides of which extend in a row direction, and the other opposed two sides of which extend in a column direction perpendicular to the row direction. That is, a large number of pixels 100 are disposed by setting a line of a plurality of pixels 100 arranged in the row direction as a pixel row, and by arranging a large number of pixel rows in the column direction. Alternatively, a large number of pixels 100 are disposed by setting a line of a plurality of pixels 100 arranged in the column direction as a pixel column, and by arranging a large number of pixel columns in the row direction. Each of the pixels 100 includes a light receiving portion serving as a part adapted to detect R-, G-, and B-light and to generate and store electric charge corresponding to the detected light. Also, each f the pixels 100 includes a signal read circuit including a MOS transistor adapted to read a signal corresponding to the electric charge stored in the light receiving portion.

A row selection scan portion 102 adapted to supply drive signals to signal read circuits included in each of the pixels 100 to drive the signal read circuits, a signal processing portion 103 adapted to perform signal processing, such as correlated double sampling and A/D conversion, on R-, G-, and B-color signals read from the signal read circuits of each of the pixels 100, and a control portion 104 adapted to generate timing pulses for driving the light receiving portion included in each of the pixels 100, to supply the generated pulses to each of the light receiving portions, and to control the row selection scan portion 102 and the signal processing portion 103 are formed on an n-type silicon substrate 120.

Each of two kinds of signal lines (reset signal lines 109 and row selection signal lines 110), through which drive signals used to drive the signal read circuits included in each of the pixels 100 are supplied, is formed on the n-type silicon substrate 120 to extend in the row direction between the corresponding adjacent pixel rows. Each pair of the reset signal line 109 and the row selection signal line 110 is provided corresponding to an associated pixel row. Each pair of the reset signal line 109 and the row selection signal line 110 is connected to the signal read circuit of each of the pixels 100 included in the pixel row, and to the row selection scan portion 102. Drive signals are supplied from the row selection scan portion 102 to the signal read circuit through the reset signal line 109 and the row selection signal line 110. Thus, a signal read operation of the signal read circuit is controlled.

The row selection scan portion 102 selects the pixel rows, which are arranged serially from the top of the solid-state imaging device shown in FIG. 1, one by one sequentially. Thus, an operation of reading signals is controlled in units of one pixel row.

Each of three kinds of signal lines (color column signal lines 111r, 111g, and 111b), through which R-, G-, and B-color signals are transmitted to the signal processing portion 103, is formed on the n-type silicon substrate 120 to extend in the column direction between the corresponding adjacent pixel columns. The color column signal lines 111r, 111g, and 111b are provided corresponding to each of the pixel columns. The color column signal lines 111r, 111g, and 111b are connected to the signal read circuit of each of the pixels 100 included in the associated pixel column, and to the signal processing portion 103.

Figure 2:
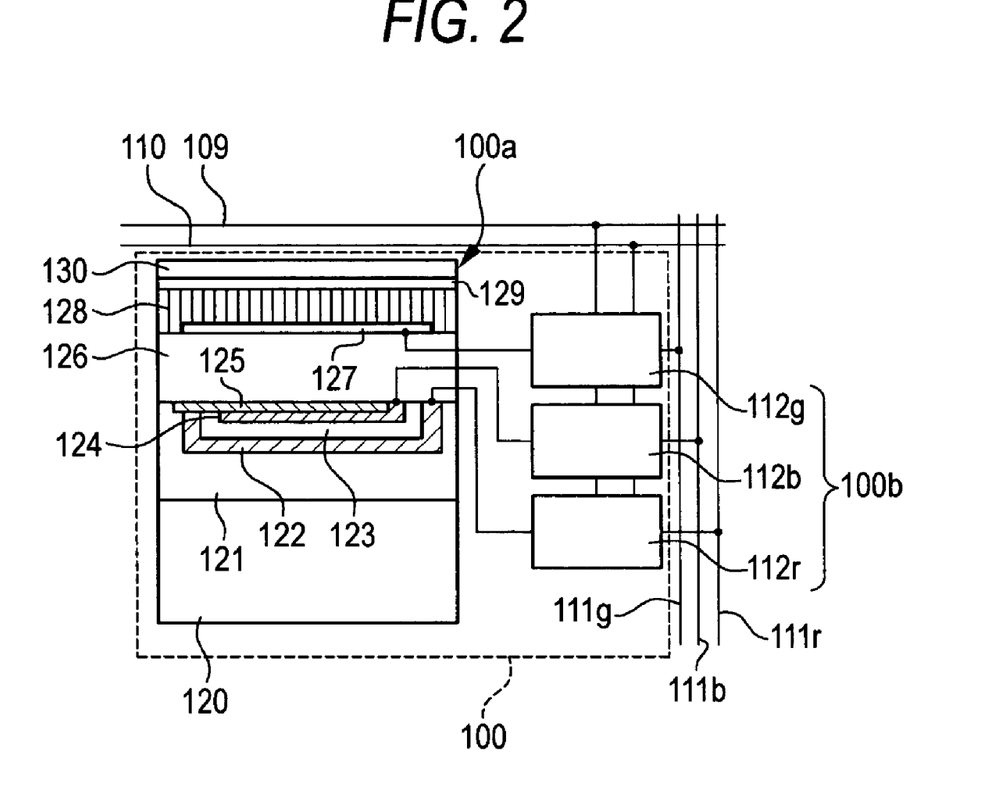
FIG. 2 is a schematic view illustrating the outline configuration of a pixel shown in FIG. 1.

FIG. 2 is a schematic view illustrating the outline configuration of one pixel shown in FIG. 1. FIG. 2 schematically shows an outline cross-section of the light receiving portion and the signal read circuit connected to the light receiving portion. As shown in FIG. 2, the pixel 100 includes the light receiving portion 100a and the signal read circuit 100b.

A p-well layer 121 formed in a surface portion of the n-type silicon substrate 120. A p+-type semiconductor layer 125, an n-type semiconductor layer 124, a p-type semiconductor layer 123, and an n-type semiconductor layer 122 are formed in the p-well layer 121 from a shallow position to a deep position in this order, A transparent insulating film 126 is stacked on the n-type silicon substrate 120. A pixel electrode film 127 (corresponding to the above first electrode film) divided corresponding to each light receiving portion 100a is formed on the transparent insulating film 126. The pixel electrode film 127 is made of an optically transparent material or a low-optical-absorption material, for example, a metal compound, such as ITO, or a very thin metal film.

A photoelectric conversion film 128, which is constituted by a single piece of film in common among the light receiving portions 100a of all of the pixels, is stacked on the pixel electrode film 127. This photoelectric conversion film 128 is sensitive mainly to light of a wavelength range of green (G) and generates signal charges corresponding to an amount of green light of incident light. The structure of the photoelectric conversion film 128 may be either a single layer structure or a multilayer structure. The photoelectric conversion film 128 is formed mainly of an organic semiconductor material sensitive to green light, or an organic material including an organic dye sensitive to green light. For example, most (more than 50%) of the photoelectric conversion film 128 is derived from an organic semiconductor material. The organic semiconductor material, in which the mobility of positive holes is larger than the mobility of electrons, is employed.

A transparent common electrode film 129 (a counter electrode film (corresponding to the second electrode film) of the pixel electrode film 127) is formed on the photoelectric conversion film 128. A transparent protection film 130 is formed on the common electrode film 129. The counter electrode film 129 maybe a single film-like electrode that is provided in common to the light receiving portions 100a of all of the pixels. Alternatively, similarly to the pixel electrode film 127, the counter electrode film 129 may be formed by being divided to correspond to each of the light receiving portions 100a so that pieces of the film, which are obtained by the division, are connected by a common wire. The material of the counter electrode film 129 is, for example, a metal compound, such as ITO, or a very thin metal film. However, the material of the counter electrode film 129 needs to be optically transparent or to be low in optical absorption. During imaging, a voltage is applied to each of the pixel electrode film 127 and the counter electrode film 129 so that an electric field sufficient to move positive holes generated in the photoelectric conversion film 128 to the pixel electrode film 127 is induced in the photoelectric conversion film 128.

A part defined by the pixel electrode film 127, among the pixel electrode film 127, the photoelectric conversion film 128, and the counter electrode film 129, constitutes a G-light photoelectric conversion element serving as the on-substrate photoelectric conversion element adapted to detect G-light and to generate signal charges corresponding to the detected G-light. Further, the PN-junction formed between n-type semiconductor layer 124 and the p-type semiconductor layer 123 is close to the surface portion of the silicon substrate 120. Thus, blue (B) light having a large optical absorption coefficient is a dominant component of light reaching the PN-junction. Consequently, a B-light photoelectric conversion element (photodiode) is formed, which serves as the intra-substrate photoelectric conversion element adapted to detect B-light and to generate signal charges corresponding to the detected B-light. The PN-junction formed between the n-type semiconductor layer 122 and the p-well layer 121 is located in a deep portion of the silicon substrate 120. Thus, red (R) light having a small optical absorption coefficient is a dominant component of light reaching this PN-junction. Consequently, an R-light photoelectric conversion element (photodiode) is formed, which serves as the intra-substrate photoelectric conversion element adapted to detect R-light and to generate signal charges corresponding to the detected R-light.

The G-light photoelectric conversion element, the B-light photoelectric conversion element, and R-light photoelectric conversion element are stacked so that light transmitted by the G-light photoelectric conversion element is absorbed by the B-light photoelectric conversion element, and that light transmitted by the B-light photoelectric conversion element is absorbed by the R-light photoelectric conversion element.

An input terminal of the signal read circuit 112g (corresponding to the above second signal read circuit) adapted to read G-signals corresponding to positive holes, which are obtained by photoelectric conversion in the photoelectric conversion film 128 and are stored in the pixel electrode film 127, is connected to the pixel electrode film 127. The signal read circuit 112g is formed in the p-well layer 121 and the transparent insulating film 126.

An input terminal of the signal read circuit 112b (corresponding to the above first signal read circuit) adapted to read B-signals corresponding to electrons, which are obtained by photoelectric conversion in the B-light photoelectric conversion element and are stored in the n-type semiconductor layer 124, is connected to the n-type semiconductor layer 124. The signal read circuit 112b is formed in the p-well layer 121 and the transparent insulating film 126.

An input terminal of the signal read circuit 112r (corresponding to the above first signal read circuit) adapted to read R-signals corresponding to electrons, which are obtained by photoelectric conversion in the R-light photoelectric conversion element and are stored in the n-type semiconductor layer 122, is connected to the n-type semiconductor layer 122. The signal read circuit 112r is formed in the p-well layer 121 and the transparent insulating film 126.

Figure 3A:
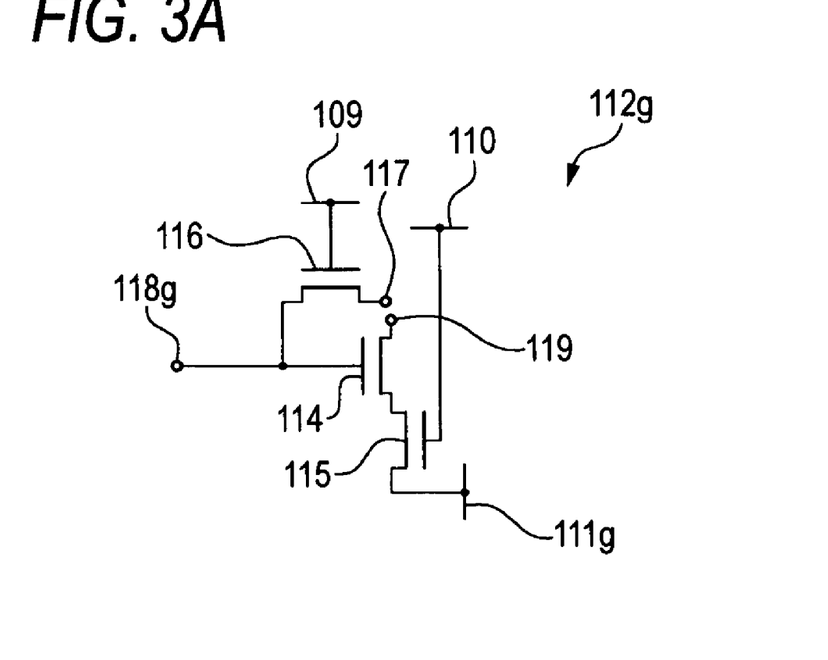
FIGS. 3A and 3B are views illustrating a practical example of the configuration of a signal read circuit shown in FIG. 2.
Figure 3B:
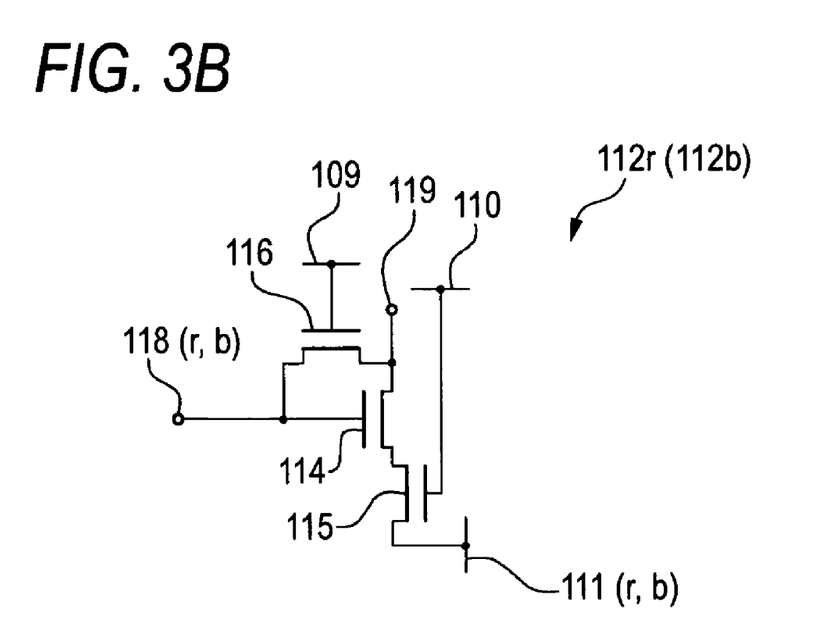

Next, the configuration of each of the signal read circuits 112r, 112g, and 112b is described below with reference to FIGS. 3A and 3B. The signal read circuits 112r and 112b are of the same configuration. Thus, the configurations of the signal read circuits 112r and 112g are described below. FIGS. 3A and 3B show the practical configurations of the signal read circuits shown in FIG. 2. FIG. 3A shows the configuration of the signal read circuit 112g. FIG. 3B shows the configuration of each of the signal read circuits 112r and 112b.

As shown in FIG. 3A, the signal read circuit 112g has an output transistor 114 adapted to convert positive holes stored in the pixel electrode film 127 to signals corresponding to an amount of the stored positive holes, a row selection transistor 115 adapted to select the pixel row, and a reset transistor 116 adapted to reset the positive hole stored in the pixel electrode film 127. To prevent occurrence of color mixture due to ingress of light, these transistors are formed in the p-well layer 121 covered with light shielding film (not shown). All of the transistors included in the signal read circuit 112g are n-channel MOS transistors.

The output transistor 114 has a gate connected to an input terminal 118g and also has a drain connected to a power supply terminal 119. The reset transistor 116 has a gate connected to the reset signal line 109, a source connected to the input terminal 118g, and a drain connected to a power supply terminal 117. The row selection transistor 115 has a gate connected to the row selection signal line 110, a drain connected to the source of the output transistor 114, and a source connected to the color column signal line 111g.

As shown in FIG. 3B, the signal read circuit 112r has an output transistor 114 adapted to convert electrons generated by the R-light photoelectric conversion element and stored in the n-type semiconductor layer 122 to signals corresponding to an amount of the stored electrons, a row selection transistor 115 adapted to select the pixel row, and a reset transistor 116 adapted to reset the electrons generated by the R-light photoelectric conversion element and stored in the n-type semiconductor layer 122. To prevent occurrence of color mixture due to ingress of light, these transistors are formed in the p-well layer 121 covered with light shielding film (not shown). All of the transistors included in the signal read circuit 112r are n-channel MOS transistors.

The output transistor 114 has a gate connected to an input terminal 118r and also has a drain connected to the power supply terminal 119. The reset transistor 116 has a gate connected to the reset signal line 109, a source connected to the input terminal 118r, and a drain connected to the power supply terminal 119. The row selection transistor 115 has a gate connected to the row selection signal line 110, a drain connected to the source of the output transistor 114, and a source connected to the color column signal line 111r.

Regarding the signal read circuit 112b, in the foregoing description (Paragraphs Nos. 0043 and 0044) of the signal read circuit 112r, read "R" as "B", and also read "r" as "b".

The drain voltage of the reset transistor 116 of the signal read circuit 112g is set to be lower than a predetermined value. The drain voltage of the reset transistor 116 of each of the signal read circuits 112r and 112b is set to be higher than the predetermined value. This is because a positive voltage signal corresponding to the positive hole can be outputted to the column signal line by resetting the reset transistor 116 of the signal read circuit 112g to a low voltage.

In the solid-state imaging device of the above configuration, upon completion of an exposure time (an imaging time) according to an imaging instruction, the row selection scan portion 102 supplies a row selection signal to the row selection signal line 110 to thereby select an m-th pixel row (m is an integer). Consequently, positive holes stored in the pixel electrode film 127 are stored in the gate part of the output transistor 114. Then, signals corresponding to an amount of the stored positive holes are read out to the color column signal line 111g. Similarly, electrons stored in the n-type semiconductor layer 124 are stored in the gate part of the output transistor 114. Then, signals corresponding to an amount of the stored electrons are read out to the color column signal line 111b. Similarly, electrons stored in the n-type semiconductor layer 122 are stored in the gate part of the output transistor 114. Then, signals corresponding to an amount of the stored electrons are read out to the color column signal line 111r. Subsequently, signal processing is performed by the signal processing portion 103. Signals obtained from each pixel row are outputted in order of arrangement of the pixels having generated the signals.

As described above, the solid-state imaging device according to the present embodiment is configured so that regarding the G-light photoelectric conversion element, positive holes among electric charges generated in the photoelectric conversion layer 128 are stored in the pixel electrode film 127 and then the signals according to the positive holes stored therein are read out by the signal read circuit 112g, and that regarding the R-light photoelectric conversion element and the B-light photoelectric conversion element, the electrons among the electric charges generated therein are stored and then the signals corresponding to the stored electrons are read out by the signal read circuits 112r and 112b. The positive holes generated in the photoelectric conversion film 128 are used as electric charges used to read signals. Thus, the probability of occurrence of annihilation of the electric charge, which is generated in the photoelectric film 128, during moved in the photoelectric film 128, and the probability of occurrence of trapping the electric charge at the trap level can be reduced. Especially, in the case of G-light, a large number of electrons are generated at the side of the counter electrode film 129 in the photoelectric conversion film 128. Thus, as compared with the case of using electrons as electric charges for reading out signals, the probabilities can be made to be lower. Consequently, the sensitivity for G-light can be enhanced. Thus, the imaging device can be more sharply sensitive to G-light. The color separation characteristic and the color reproducibility corresponding to G-light can be enhanced.

Meanwhile, in the case of B-light and R-light, it is necessary to treat electric charges in the silicon substrate. Thus, electrons, whose mobility is larger than that of positive holes, are used as electric charges for reading signals. Consequently, the probability of occurrence of annihilation of electrons, which are generated in response to B-light and R-light, during the transfer of the generated electrons, can be reduced. Also, the reduction in the sensitivity for R-light and B-light can be prevented.

The configuration of each of the signal read circuits 112g, 112r, and 112b used in the solid-state imaging device according to the present embodiment is a known configuration using three transistors. Thus, even in a case where the electric charge for reading signals is a positive hole, n-channel MOS transistors can be used as the three transistors. That is, all of the signal read circuits 112g, 112r, and 112b can be constituted by the n-cannel MOS transistors. Consequently, the enhancement of the sensitivity of and the miniaturization of the solid-state imaging device can be achieved.

Incidentally, in the solid-state imaging device according to the present embodiment, each of transistors other than those used in the pixels 100 may be either a p-channel MOS transistor or an n-channel MOS transistor.

Although each of the signal read circuits 112r and 112b is constituted by three transistors, the configurations of the signal read circuits according to the invention are not limited thereto. Each of the signal read circuits 112r and 112b may be of a known configuration using four transistors. In the case of using four transistors, kTC noises can be removed by performing CDS processing. Thus, low-noise imaging signals can be obtained. The miniaturization of the pixels is facilitated, in the case of using three transistors, similarly to the present embodiment.

Incidentally, in the solid-state imaging device according to the present embodiment, the voltage applied to the counter electrode film 129 is set at a high value of 5V to 15V, the mobility of a positive hole in the photoelectric conversion film 128 is increased. The sensitivity for G-light is increased. This is very preferable for the solid-state imaging device. However, in a case where the magnitude of an optical input signal is large, the voltage of the pixel electrode film 127 is close to that of the counter electrode film 129. The voltage of the pixel electrode film 127 is applied to the gate of the output transistor 114 and the source of the transistor 116. Generally, transistors operate at a voltage that is equal to or less than 3.3V. Therefore, when a voltage ranging from 5V to 15V is applied to the output transistor 114 and the reset transistor 116, the breakdown of the transistors occur. It is preferable for preventing the occurrence of the breakdown of the transistors to provide a protection circuit in the signal read circuit 112g.

Figure 4:
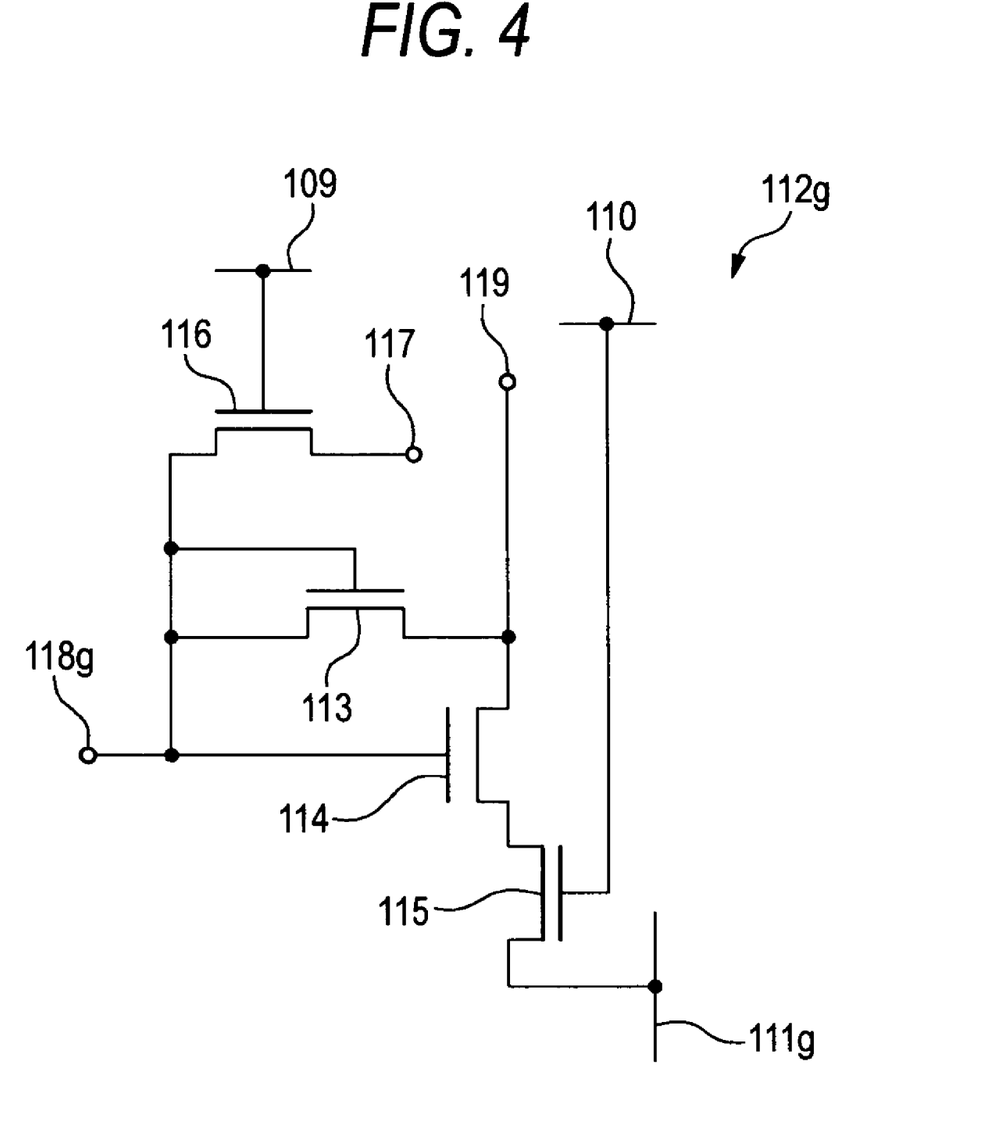
FIG. 4 is a view illustrating the configuration of a signal read circuit provided with a protection circuit.

FIG. 4 is a view illustrating the configuration of the signal read circuit 112g provided with the protection circuit. In FIG. 4, like reference numeral designate like components similar to those shown in FIG. 3A.

The signal read circuit 112g shown in FIG. 4 is obtained by adding a protection transistor 113, which is an n-channel MOS transistor whose source and gate are connected to the input terminal 118g, and whose drain is connected to the power supply terminal 119, to the signal read circuit 112g shown in FIG. 3A.

The protection transistor 113 performs a function of holding the voltage of the pixel electrode film 127 at a value, which is equal to or less than a predetermined voltage, and a function of protecting the reset transistor 116 and the output transistor 114 connected to the pixel electrode film 127. Thus, the gate threshold voltage of the protection transistor 113 is selected so that when the voltage of the gate, which is equivalent to the voltage of the pixel electrode film 128, is equal to the predetermined voltage, the drain and the source thereof are conducted to each other. The voltage supplied from the power supply terminal 119 is set to be less than the predetermined voltage.

In a case where the predetermined voltage is set at 4V, where the voltage supplied from the power supply terminal 119 is set at 3.3V, and where strong light is incident on the photoelectric conversion film 128, the voltage of the pixel electrode film 127 rises. However, when the voltage of the pixel electrode film 127 exceeds 4V, the pixel electrode film 127 is conducted to the power supply terminal 119. Consequently, the rise of the voltage of the pixel electrode film 127 is stopped and is held at about 4V. That is, even when the voltage of the counter electrode film 129 is at a high level of 5V to 15V, the voltage of the pixel electrode film 127 is always equal to or less than about 4V. Thus, occurrence of the breakdown of the output transistor 114 and the reset transistor 116 can be prevented.

According to the invention, the sensitivity and the color reproducibility of the hybrid type solid-state image sensing device can be enhanced.

The entire disclosure of each and every foreign patent application from which the benefit of foreign priority has been claimed in the present application is incorporated herein by reference, as if fully set forth.

What is claimed is:

1. A solid-state imaging device comprising a plurality of pixels arranged in a row direction and a column direction perpendicular to the row direction, wherein each of said plurality of pixels comprises:

(i) a light receiving portion comprising a plurality of intra-substrate photoelectric conversion portions that are formed in a silicon substrate and that detect light rays of different color, an on-substrate photoelectric conversion portion that is stacked above said plurality of intra-substrate photoelectric conversion portions and that detects light rays of a color differing from the colors detected by said plurality of intra-substrate photoelectric conversion portions;

(ii) a first signal read circuit that reads signals corresponding to electric charges generated and stored in the intra-substrate photoelectric conversion portions; and (iii) a second signal read circuit that reads signals corresponding to electric charges generated and stored in the on-substrate photoelectric conversion portion, wherein the electric charges generated and stored in the intra-substrate photoelectric conversion portions are electrons, wherein the electric charges generated and stored in the on-substrate photoelectric conversion portions are positive holes, wherein each of the first signal read circuit and the second signal read circuit comprises an output transistor that converts an electric charge into a signal, a reset transistor that resets an electric charge and a selection transistor that selects the pixel, wherein the output transistor, the reset transistor, and the selection transistor are n-channel MOS transistors, and wherein a drain voltage of the reset transistor of the second signal read circuit is set to be lower than a drain voltage of the reset transistor of the first signal read circuit.

2. The solid-state imaging device according to claim 1, wherein the on-substrate photoelectric conversion element comprises: a first electrode film stacked above the semiconductor substrate; a photoelectric conversion film stacked above the first electrode film; and a second electrode film stacked above the photoelectric conversion film, wherein the photoelectric conversion film comprises an organic semiconductor, and wherein a mobility of a positive hole in the organic semiconductor is larger than a mobility of an electron.

3. The solid-state imaging device according to claim 2, wherein a voltage is applied to each of the first electrode film and the second electrode film during an imaging time so that a positive hole generated in the photoelectric conversion film is stored in the first electrode film.

4. The solid-state imaging device according to claim 3, wherein an input terminal of the second signal read circuit is connected to the first electrode film, and wherein the second signal read circuit comprises a protection circuit that holds a voltage of the first electrode film at a value which is equal to or lower than a predetermined voltage, to protect transistors connected to the first electrode film.

5. The solid-state imaging device according to claim 4, wherein the protection circuit is a protection transistor in which its source and its gate are connected to the first electrode film and its drain is connected to a power supply that supplies voltage being less than the predetermined voltage, and wherein the protection transistor conducts the first electrode film to the power supply when a voltage at the gate of the protection transistor is equal to the predetermined voltage.

6. The solid-state imaging device according to claim 1, wherein said plurality of intra-substrate photoelectric conversion elements are a plurality of photodiodes which are stacked in a direction of a depth of the semiconductor substrate and which detect light rays of different colors, respectively.

7. The solid-state imaging device according to claim 1, wherein said plurality of intra-substrate photoelectric conversion elements comprises: intra-substrate photoelectric conversion elements that detects blue light; and intra-substrate photoelectric conversion element that detects red light, and wherein the on-substrate photoelectric conversion element detects green light.

* * * * *